US009373647B2

(12) United States Patent
Lee et al.

(10) Patent No.: US 9,373,647 B2
(45) Date of Patent: Jun. 21, 2016

(54) THIN FILM TRANSISTOR ARRAY PANEL AND LIQUID CRYSTAL DISPLAY INCLUDING THE SAME (71) Applicant: Samsung Display Co., Ltd., Yongin, Gyeonggi-Do (KR)

(72) Inventors: Hong Beom Lee, Hwaseong-si (KR); Jun-Seok Lee, Cheonan-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 175 days.

(21) Appl. No.: 14/307,705

(22) Filed: Jun. 18, 2014

(65) Prior Publication Data

US 2015/0109554 A1 Apr. 23, 2015

(30) Foreign Application Priority Data

Oct. 23, 2013 (KR) .................. 10-2013-0126513

(51) Int. Cl.
G02F 1/1343 (2006.01)
G02F 1/1368 (2006.01)
H01L 27/12 (2006.01)
G02F 1/1362 (2006.01)
G02F 1/1337 (2006.01)

(52) U.S. Cl.
CPC ............ H01L 27/124 (2013.01); G02F 1/1362 (2013.01); G02F 2001/133776 (2013.01)

(58) Field of Classification Search
None
See application file for complete search history.

(56) References Cited

U.S. PATENT DOCUMENTS

| 8,310,643 B2* | 11/2012 | Song ................. G02F 1/133707 349/129 |
| 8,325,306 B2 | 12/2012 | Nakanishi et al. |
| 2007/0085847 A1* | 4/2007 | Shishido .............. G09G 3/3233 345/204 |
| 2008/0273131 A1* | 11/2008 | Kim ..................... G02F 1/13624 349/38 |
| 2009/0027581 A1* | 1/2009 | You ..................... G02F 1/13624 349/48 |
| 2009/0310047 A1* | 12/2009 | Shin .................... G09G 3/3659 349/37 |
| 2010/0157185 A1* | 6/2010 | Kim ..................... G02F 1/1362 349/38 |
| 2011/0115998 A1* | 5/2011 | Liao .................. G02F 1/136213 349/38 |
| 2012/0182489 A1* | 7/2012 | Wang .................. G02F 1/13624 349/38 |
| 2012/0224128 A1* | 9/2012 | Jung .................. G02F 1/134309 349/129 |
| 2013/0127829 A1 | 5/2013 | Hou et al. |
| 2014/0009448 A1* | 1/2014 | Chi ....................... H01L 27/124 345/204 |

FOREIGN PATENT DOCUMENTS

| JP | 2007-212914 A | 8/2007 |
| KR | 1020010064411 A | 7/2001 |
| KR | 100591898 B1 | 6/2006 |
| KR | 100853770 B1 | 8/2008 |
| KR | 1020110078896 A | 7/2011 |
| KR | 1020120119411 A | 10/2012 |
| KR | 1020120119427 A | 10/2012 |
| KR | 101244691 B1 | 3/2013 |

* cited by examiner

Primary Examiner — Ryan Crockett
(74) Attorney, Agent, or Firm — Cantor Colburn LLP (57) ABSTRACT A thin film transistor array panel includes: first to third gate lines extending in one direction and parallel to each other; a data line insulated from and intersecting the first to third gate lines; a first thin film transistor connected to the first gate line and the data line; a second thin film transistor connected to the second gate line and an output terminal of the first thin film transistor; a third thin film transistor connected to the third gate line and the data line; a fourth thin film transistor connected to the second gate line and an output terminal of the third thin film transistor; and first to fourth sub-pixel electrodes respectively connected to the first to fourth thin film transistors.

20 Claims, 6 Drawing Sheets

THIN FILM TRANSISTOR ARRAY PANEL AND LIQUID CRYSTAL DISPLAY INCLUDING THE SAME

This application claims priority to Korean Patent Application No. 10-2013-0126513 filed on Oct. 23, 2013, and all the benefits accruing therefrom under 35 U.S.C. §119, the entire contents of which are incorporated herein by reference.

BACKGROUND (a) Field

The invention relates to a thin film transistor array panel and a liquid crystal display including the same.

(b) Description of the Related Art

A liquid crystal display is a type of flat panel display that is widely used. A liquid crystal display includes two display panels in which field generating electrodes such as pixel electrodes and a common electrode are disposed, and a liquid crystal layer that is interposed therebetween. The liquid crystal display generates an electric field in the liquid crystal layer by applying a voltage to the field generating electrodes, thereby determining a direction of liquid crystal molecules of the liquid crystal layer and displaying an image by controlling polarization of incident light.

Among liquid crystal displays, a vertically aligned mode liquid crystal display, in which liquid crystal molecules are aligned so that long axes thereof are perpendicular to the upper and lower display panels while the electric field is not applied, has advantages of a relatively large contrast ratio and wide reference viewing angle.

In the vertical alignment ("VA") mode liquid crystal display, to obtain the wide viewing angle, a plurality of domains in which the alignment directions of the liquid crystal molecules are different, may be formed in one pixel.

For forming the plurality of domains in one pixel of the liquid crystal display, methods in which a minute slit or a cutout is defined in the field generating electrodes or a protrusion is disposed on the field generating electrodes have been proposed. In these methods, the plurality of domains may be formed by aligning the liquid crystal molecules vertically with respect to a fringe field generated between the edges of the cutout or the protrusion, and the field generating electrodes facing the edges.

However, the wide viewing angle may not be sufficiently obtained through these methods.

SUMMARY

One or more exemplary embodiment of the invention provides a thin film transistor array panel with improved lateral visibility by disposing four sub-pixel electrodes in one pixel and respectively driving each sub-pixel electrode by using one data line and three gate lines, and a liquid crystal display including the same.

A thin film transistor array panel includes: a plurality of gate lines including a first gate line, a second gate line and a third gate line extending in one direction and parallel to each other; a data line insulated from and intersecting the first gate line, the second gate line and the third gate line; a first thin film transistor connected to the first gate line and the data line; a second thin film transistor connected to the second gate line and an output terminal of the first thin film transistor; a third thin film transistor connected to the third gate line and the data line; a fourth thin film transistor connected to the second gate line and an output terminal of the third thin film transistor; a first sub-pixel electrode connected to the first thin film transistor; a second sub-pixel electrode connected to the second thin film transistor; a third sub-pixel electrode connected to the third thin film transistor; and a fourth sub-pixel electrode connected to the fourth thin film transistor.

The first sub-pixel electrode and the second sub-pixel electrode may be above the plurality of gate lines, and the third sub-pixel electrode and the fourth sub-pixel electrode may be below the plurality of gate lines, in one pixel.

The first, second and third gate lines may respectively include a first, second and third gate electrode, and an area of the second gate electrode of the second gate line may be larger than an area of the first gate electrode of the first gate line and the third gate electrode of the third gate line.

The first thin film transistor may include the first gate electrode of the first gate line, the third thin film transistor may include the third gate electrode of the third gate line, and the second thin film transistor and the fourth thin film transistor may include the second gate electrode of the second gate line.

The data line may include a first source electrode of the first thin film transistor, on the first gate electrode, and a third source electrode of the third thin film transistor, on the third gate electrode.

The thin film transistor array panel may further include a data conductor which includes the data line and a first connection, and the first connection may connect the first gate electrode of the first gate line, the second gate electrode of the second gate line and the first sub-pixel electrode.

A first end of the first connection may include a first drain electrode of the first thin film transistor, a second end opposite to the first end of the first connection may be a second source electrode of the second thin film transistor, and the first connection may include a branch portion protruded from between the first and second ends thereof, connected to the first sub-pixel electrode.

The thin film transistor array panel may further include a data conductor which includes the data line and a second connection, and the second connection may connect the second gate electrode of the second gate line, the third gate electrode of the third gate line and the third sub-pixel electrode.

A first end of the second connection may be a third drain electrode of the third thin film transistor, a second end opposite to the first end of the second connection may be a fourth source electrode of the fourth thin film transistor, and the second connection may include a branch portion protruded from between the first and second ends thereof, connected to the third sub-pixel electrode.

The thin film transistor array panel may further include a data conductor which includes the data line, and a third connection parallel to the data line. A first end of the third connection may be a second drain electrode of the second thin film transistor, and a second end opposite to the first end of the third connection may be connected to the second sub-pixel electrode.

The thin film transistor array panel may further include a data conductor which includes the data line, and a fourth connection parallel to the data line. A first end of the fourth connection may be a fourth drain electrode of the fourth thin film transistor, and a second end opposite to the first end of the fourth connection may be connected to the fourth sub-pixel electrode.

Signals applied to the data line and the first to third gate lines, may independent drive the first to fourth sub-pixel electrodes.

A data voltage applied to first gate line may charge the first sub-pixel electrode and the second sub-pixel electrode, a data voltage applied to the second gate line may charge the second sub-pixel electrode and the fourth sub-pixel electrode, and a data voltage applied to the third gate line may charge the third sub-pixel electrode and the fourth sub-pixel electrode.

The data voltages applied to the first to fourth sub-pixel electrodes may be respectively different.

A sub-pixel electrode among the first to fourth sub-pixel electrodes may include a cross-shaped stem which divides the sub-pixel electrode into four sub-regions, and minute branches extending in different diagonal directions respectively in the four sub-regions.

One pixel may include the first to fourth sub-pixel electrodes, each of the first to fourth sub-pixel electrodes may include the cross-shaped stem and the minute branches, and sixteen sub-regions may be defined in the one pixel.

A liquid crystal display includes: a first substrate; a second substrate including a common electrode; and a liquid crystal between the first substrate and the second substrate. The first substrate includes a plurality of gate lines including a first gate line, a second gate line and a third gate line extending in one direction and parallel to each other; a data line insulated from and intersecting the first gate line, the second gate line and the third gate line; a first thin film transistor connected to the first gate line and the data line; a second thin film transistor connected to the second gate line and an output terminal of the first thin film transistor; a third thin film transistor connected to the third gate line and the data line; a fourth thin film transistor connected to the second gate line and an output terminal of the third thin film transistor; a first sub-pixel electrode connected to the first thin film transistor; a second sub-pixel electrode connected to the second thin film transistor; a third sub-pixel electrode connected to the third thin film transistor; and a fourth sub-pixel electrode connected to the fourth thin film transistor.

The first sub-pixel electrode and the second sub-pixel electrode may be above the plurality of gate lines, and the third sub-pixel electrode and the fourth sub-pixel electrode may be above the plurality of gate lines, in one pixel.

The first, second and third gate lines may respectively include a first, second and third gate electrode, and an area of the second gate electrode of the second gate line may be larger than an area of the first gate electrode of the first gate line and the third gate electrode of the third gate line.

A data voltage applied to the first gate line may charge the first sub-pixel electrode and the second sub-pixel electrode, a data voltage applied to the second gate line may charge the second sub-pixel electrode and the fourth sub-pixel electrode, and a data voltage applied to the third gate line may charge the third sub-pixel electrode and the fourth sub-pixel electrode.

As described above, one or more exemplary embodiment of the thin film transistor array panel and the liquid crystal display including the same of the invention disposes four sub-pixel electrodes in one pixel and charges different data voltages to each sub-pixel electrode with different gate timings, by using three gate lines and one data line, thereby improving lateral visibility of the liquid crystal display.

BRIEF DESCRIPTION OF THE DRAWINGS

The above and other features of this disclosure will become more apparent by describing in further detail exemplary embodiments thereof with references to the accompanying drawings, in which.

DETAILED DESCRIPTION

The invention will be described more fully hereinafter with reference to the accompanying drawings, in which exemplary embodiments of the invention are shown. As those skilled in the art would realize, the described embodiments may be modified in various different ways, all without departing from the spirit or scope of the invention.

In the drawings, the thickness of layers, films, panels, regions, etc., are exaggerated for clarity. Like reference numerals designate like elements throughout the specification. As used herein, the term "and/or" includes any and all combinations of one or more of the associated listed items. It will be understood that when an element such as a layer, film, region, or substrate is referred to as being "on" another element, it can be directly on the other element or intervening elements may also be present. In contrast, when an element is referred to as being "directly on" another element, there are no intervening elements present. As used herein, connected may refer to elements being physically and/or electrically connected to each other.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "under" relative to other elements or features would then be oriented "above" relative to the other elements or features. Thus, the exemplary term "under" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the invention will be described in detail with reference to the accompanying drawings.

Now, exemplary embodiments of a thin film transistor array panel and a liquid crystal display including the thin film transistor array panel according to the invention will described with reference to accompanying drawings.

Figure 1:
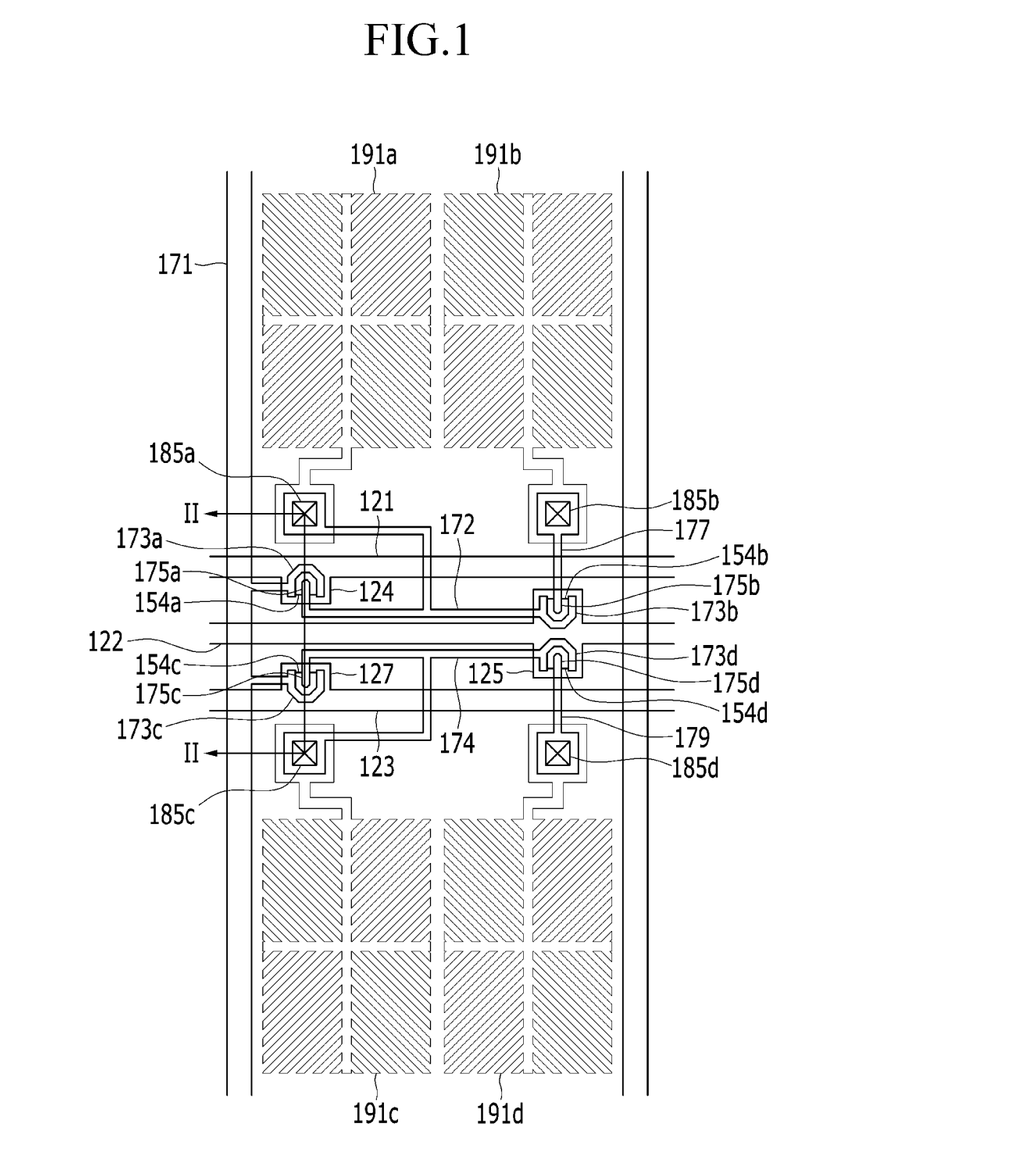
FIG. 1 is a plan view of an exemplary embodiment of a thin film transistor array panel according to the invention.
Figure 2:
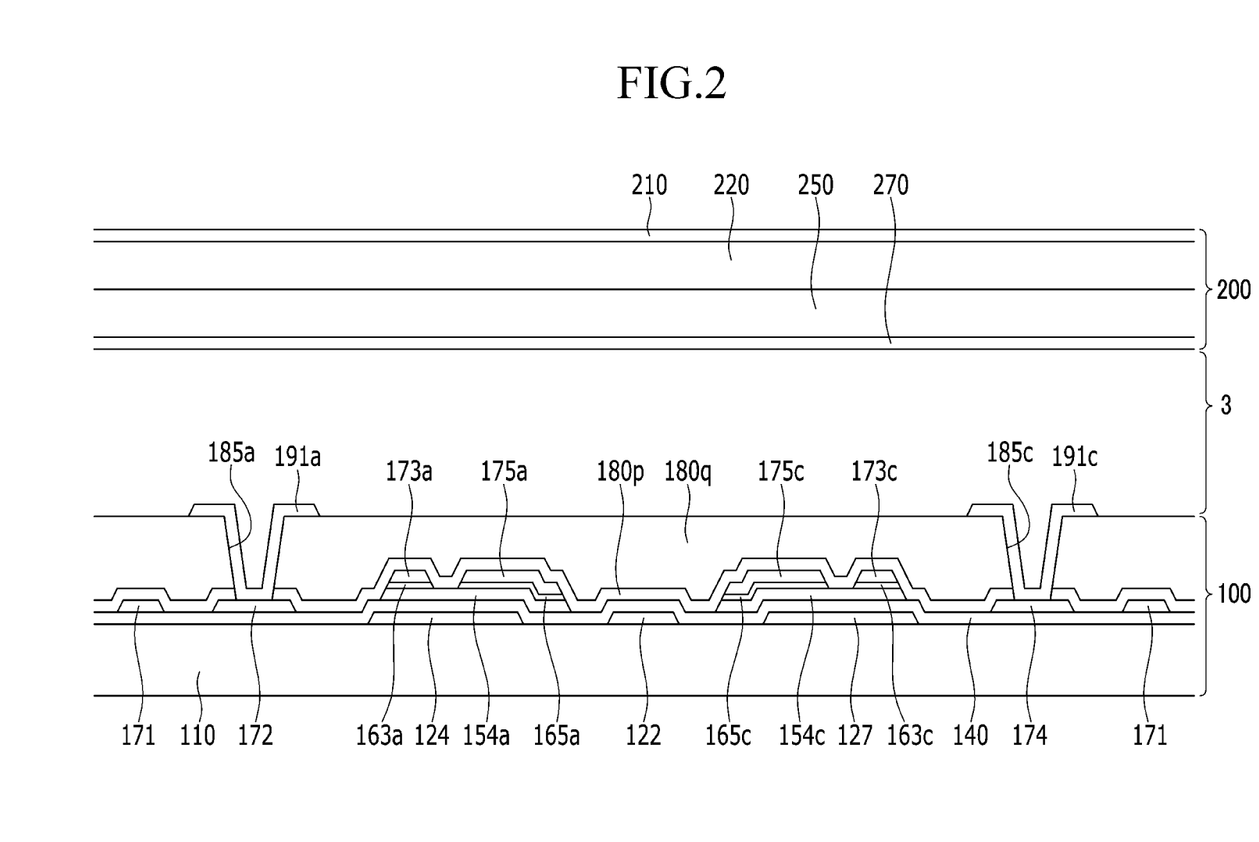
FIG. 2 is a cross-sectional view of an exemplary embodiment of a liquid crystal display including the thin film transistor array panel of FIG. 1, taken along line II-II of FIG. 1.

Firstly, exemplary embodiments of a thin film transistor array panel and a liquid crystal display including the thin film transistor array panel according to the invention will described with reference to FIG. 1 and FIG. 2. FIG. 1 is a plan view of an exemplary embodiment of a thin film transistor array panel according to the invention, and FIG. 2 is a cross-sectional view of an exemplary embodiment of a liquid crystal display including the thin film transistor array panel of FIG. 1, taken along line II-II of FIG. 1.

Firstly, the thin film transistor array panel 100, as a lower display panel of the liquid crystal display, will be described.

A gate conductor including a plurality of gate lines 121, 122 and 123 is disposed on a first insulation substrate 110. The gate conductor is in a same layer of the thin film transistor array panel 100. The first insulation substrate 110 may include a transparent glass or plastic.

The plurality of gate lines 121, 122 and 123 extend in one direction and includes three gate lines 121, 122 and 123 disposed in parallel for one pixel of the liquid crystal display. The collective plurality of gate lines 121, 122 and 123 transverse a center of the one pixel. As an exemplary embodiment, FIG. 1 shows one pixel of a liquid crystal display, but the invention is not limited to the structure or configuration defined therein.

The three gate lines 121, 122 and 123 passing through a center of one pixel in parallel in a transverse direction (e.g., horizontal in FIG. 1) are respectively referred to as a first gate line 121, a second gate line 122 and a third gate line 123.

Each gate line among the plurality of gate lines 121, 122 and 123 includes a gate electrode and an end (not shown) having a relatively wide planar area for connection with other layers or an external driving circuit (not shown).

A first gate electrode 124 of the first gate line 121 and a third gate electrode 127 of the third gate line 123 have similar planar areas. However, a planar area of a second gate electrode 125 of the second gate line 122 is larger than the respective planar areas of the first gate electrode 124 and the third gate electrode 127. The planar area of the gate electrode may include only a portion of the gate line protruding from a main elongated portion thereof, or may include both the protruded and main portions at the gate electrode.

When considering a bisected one pixel, the first gate electrode 124 and the third gate electrode 127 are positioned at one side, and the second gate electrode 122 is positioned at a side opposing the one side of the respective first or third gate electrode 124 or 127.

The gate lines 121, 122 and 123 may include a material such as an aluminum-based metal of aluminum (Al) or aluminum alloys, a silver-based metal of silver (Ag) or silver alloys, a copper-based metal of copper (Cu) or copper alloys, a molybdenum-based metal of molybdenum (Mo) or molybdenum alloys, chromium (Cr), tantalum (Ta) and titanium (Ti). The gate lines 121, 122 and 123 have a single layer structure. However, in exemplary embodiments, the gate lines 121, 122 and 123 may have a multilayer structure including at least two conductive layers having different physical properties.

A gate insulating layer 140 including a silicon nitride (SiNx) or a silicon oxide (SiOx) is disposed on the gate conductor. The gate insulating layer 140 may have a single layer structure. However, in exemplary embodiments, the gate insulating layer 140 may have a multilayer structure including at least two insulating layers having different physical properties.

A semiconductor including a plurality of semiconductor islands 154a, 154b, 154c and 154d is disposed on the gate insulating layer 140. The semiconductor may include amorphous silicon or polysilicon. In exemplary embodiments, the semiconductor may include an oxide semiconductor.

The semiconductor includes a first semiconductor 154a, a second semiconductor 154b, a third semiconductor 154c and a fourth semiconductor 154d. The first semiconductor 154a is positioned on the first gate electrode 124, the second semiconductor 154b and the fourth semiconductor 154d are positioned on the second gate electrode 125, and the third semiconductor 154c is positioned on the third gate electrode 127.

A plurality of ohmic contacts is disposed on the semiconductors 154a, 154b, 154c and 154d. The ohmic contacts may include a material such as n+ hydrogenated amorphous silicon in which an n-type impurity such as phosphorus is doped at a high concentration, or silicide. The ohmic contacts may be disposed as pairs on the semiconductors 154a, 154b, 154c and 154d, respectively. In the illustrated exemplary embodiment, for example, a pair of ohmic contacts 163a and 165a are position on the first semiconductor 154a and a pair of ohmic contacts 165c and 163c are positioned on the third semiconductor 154c. When the semiconductors 154a, 154b, 154c, and 154d are oxide semiconductors, the ohmic contacts may be omitted.

A data conductor is disposed on the ohmic contacts and the gate insulating layer 140. The data conductor is in a same layer of the thin film transistor array panel 100.

The data conductor includes a refractory metal such as molybdenum, chromium, tantalum, titanium, and alloys thereof. The data conductor includes a data line 171 and a drain electrode that may have a single layer structure, or a multilayered structure including a refractory metal layer (not shown) and a low resistance conductive layer (not shown). Exemplary embodiments of multilayered structures include a dual layer structure having a chromium or molybdenum (alloy) lower layer and an aluminum (alloy) upper layer, and a triple layer structure having a molybdenum (alloy) lower layer, an aluminum (alloy) middle layer, and a molybdenum (alloy) upper layer. However, the data conductor may include other metals and/or conductors.

The data conductor extends in a longitudinal direction according to the edge of the one pixel, transmits a data signal, and includes the data line 171 intersecting the gate lines 121, 122, and 123.

The data line 171 has two branch electrodes progressing toward an inner area of the one pixel. One branch electrode extends to overlap the first gate electrode 124, thereby being a first source electrode 173a. The other branch electrode extends to overlap the third gate electrode 127, thereby being a third source electrode 173c.

The data conductor further includes a first connection 172, a second connection 177, a third connection 174 and a fourth connection 179. One end or side of each connection forms a drain electrode. That is, a first end of the first connection 172 forms a first drain electrode 175a. A first end of the second connection 177 forms a second drain electrode 175b. A first end of the third connection 174 is a third drain electrode 175c and a first end of the fourth connection 179 is a fourth drain electrode 175d.

The first drain electrode 175a is positioned on the first gate electrode 124, and the third drain electrode 175c is positioned on the third gate electrode 127. The second drain electrode 175b and the fourth drain electrode 175d are positioned on the second gate electrode 125.

The first connection 172 connecting the first drain electrode 175a and a second source electrode 173b is positioned between the first gate line 121 and the second gate line 122. The first connection 172 is positioned parallel to the gate lines 121 and 122, and includes a branch electrode that is branched at the center of the first connection 172 and extends perpendicularly to the gate lines 121 and 122. The first connection 172 connects the first gate electrode 124, the second gate electrode 125, and a first sub-pixel electrode 191a.

In detail, the first end of first connection 172 is positioned on the first gate electrode 124 and forms the first drain electrode 175a. The first source electrode 173a that as the branch electrode branched from the data line 171 and the first drain electrode 175a that is the first end of the first connection 172 form a first thin film transistor ("TFT") along with the first semiconductor 154a positioned between the first source electrode 173a and the first drain electrode 175a. A channel of the TFT is defined by a portion of the semiconductor 154a exposed between the first source electrode 173a and the first drain electrode 175a.

The branch electrode of the first connection 172 is branched at the center of the first connection 172, extends in the direction perpendicular to the extending direction of the first connection 172, and includes a relatively wide portion for contact with the first sub-pixel electrode 191a. The branch electrode of the first connection 172 is connected to the first sub-pixel electrode 191a through a contact hole 185a.

A second end opposite to the first end of the first connection 172 is positioned on the second gate electrode 125 and becomes the second source electrode 173b.

A second connection 177 is positioned substantially parallel to the data line 171, and has a relatively wide second end for contact with a second sub-pixel electrode 191b. The first end opposite to the second end of the second connection 177 becomes the second drain electrode 175b on the second gate electrode 125. The second source electrode 173b that is the first end of the first connection 172 and the second drain electrode 175b that is first end of the second connection 177 form a second TFT along with the second semiconductor 154b positioned between the second source electrode 173b and the drain electrode 175b.

The third connection 174 connecting the third drain electrode 175c and a fourth source electrode 173d is positioned between the second gate line 122 and the third gate line 123. The third connection 174 is positioned parallel to the gate lines 122 and 123, and includes a branch electrode that is branched at the center of the third connection 174 and extends perpendicularly to the gate lines 122 and 123. The extending direction of the branch electrode of the first connection 172 and the extending direction of the branch electrode of the third connection 174 are opposite to each other. The third connection 174 connects the third gate electrode 127, the second gate electrode 125 and a third sub-pixel electrode 191c.

In detail, the first end of the third connection 174 is positioned on the third gate electrode 127 and forms the third drain electrode 175c. The third source electrode 173c that is the branch electrode branched from the data line 171 and the third drain electrode 175c that is the first end of the third connection 174 form a third TFT along with the third semiconductor 154c positioned between the third source electrode 173c and the third drain electrode 175c, and the channel of the third TFT is defined by a portion of the third semiconductor 154c exposed between the third source electrode 173c and the third drain electrode 175c.

The branch electrode of the third connection 174 is branched at the center of the third connection 174, extends in the direction perpendicular to the extending direction of the third connection 174, and includes a relatively wide end for contact with the third sub-pixel electrode 191c. The branch electrode of the third connection 174 is connected to the third sub-pixel electrode 191c through a contact hole 185c.

A second end opposite to the first end of the third connection 174 is positioned on the second gate electrode 125 and becomes the fourth source electrode 173d.

A fourth connection 179 is positioned substantially parallel to the data line 171, and a second end thereof is connected to a fourth sub-pixel electrode 191d. The first end opposite to the second end of the fourth connection 179 becomes the fourth drain electrode 175d on the second gate electrode 125. The fourth source electrode 173d that is second end of the third connection 174 and the fourth drain electrode 175d that is the first end of the fourth connection 179 form a fourth TFT along with the fourth semiconductor 154d between the fourth source electrode 173d and the fourth drain electrode 175d.

A first passivation layer 180p is disposed on the data conductor, the gate insulating layer 140, and the exposed portions of the semiconductor. The first passivation layer 180p may include organic insulating material and/or inorganic insulating material.

A second passivation layer 180q is disposed on the first passivation layer 180p. In exemplary embodiments, the second passivation layer 180q may be omitted. In an exemplary embodiment of a liquid crystal display, the second passivation layer 180q may be a color filter. When the second passivation layer 180q is the color filter, one of primary colors may be uniquely displayed thereby. The primary colors may include three primary colors such as red, green and blue, or yellow, cyan and magenta. Although it is not illustrated, the color filter may further display a combination color of the primary colors, or white, other than the primary colors.

Contact holes are defined extending through cross-sectional thicknesses of the first passivation layer 180p and the second passivation layer 180q and expose portions of the first connection 172, the second connection 177, the third connection 174, and the fourth connection 179. The contact hole includes the first contact hole 185a exposing one end of the branch electrode of the first connection 172, a second contact hole 185b exposing one end of the second connection 177, the third contact hole 185c exposing one end of the branch electrode of the third connection 174, and a fourth contact hole 185d exposing one end of the fourth connection 179.

A pixel electrode is disposed on the second passivation layer 180q. The pixel electrode is divided into sub-pixel electrodes with respect to the gate lines 121, 122 and 123, and two sub-pixel electrodes are positioned at one side with respect to the gate lines 121, 122 and 123, while two different sub-pixel electrodes are positioned at an opposing other side with respect to the gate lines 121, 122 and 123. The sub-pixel electrodes that are positioned upward with respect to the gate lines 121, 122 and 123 in the plan view of FIG. 1, are referred to as the first sub-pixel electrode 191a and the second sub-pixel electrode 191b, and the sub-pixel electrodes that are positioned downward with respect to the gate lines 121, 122 and 123 in the plan view of FIG. 1, are referred to as the third sub-pixel electrode 191c and the fourth sub-pixel electrode 191d.

The pixel electrode may include a transparent material such as indium tin oxide ("ITO") and indium zinc oxide ("IZO"). The pixel electrode may include a transparent conductive material such as ITO or IZO, and/or a reflective metal such as aluminum, silver, chromium or alloys thereof. In the illustrated exemplary embodiment of FIG. 1, each sub-pixel electrode of the pixel electrode includes a stem with a cross shape, and a minute branches extending in an oblique direction from the stem.

Figure 4:
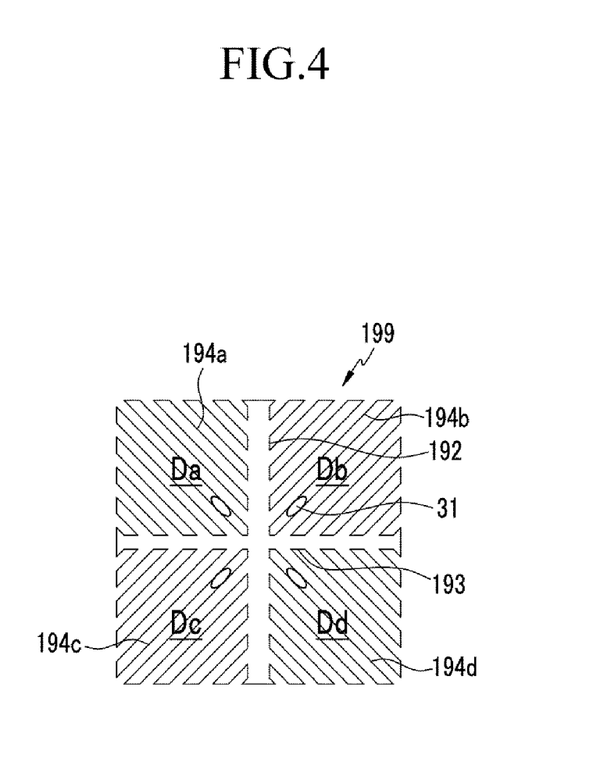
FIG. 4 is a plan view of an exemplary embodiment of a basic electrode according to the invention.

The first sub-pixel electrode 191a, the second sub-pixel electrode 191b, the third sub-pixel electrode 191c and the fourth sub-pixel electrode 191d each include a basic electrode 199 shown in FIG. 4, or variants thereof.

The first sub-pixel electrode 191a is connected to the first drain electrode 175a through the first contact hole 185a, thereby receiving the data voltage from the first drain electrode 175a. Likewise, the second sub-pixel electrode 191b is connected to the second drain electrode 175b through the second contact hole 185b, the third sub-pixel electrode 191c is connected to the third drain electrode 175c through the third contact hole 185c, and the fourth sub-pixel electrode 191d is connected to the fourth drain electrode 175d through the fourth contact hole 185d, thereby receiving the data voltages from the respective drain electrodes.

Next, an upper display panel 200 will be described.

A light blocking member 220 is disposed on a second insulation substrate 210, and the second insulation substrate 210 may include transparent glass or the like. The light blocking member 220 is also referred to as a black matrix and prevents light leakage.

A plurality of color filters (not shown) is disposed on the second insulation substrate 210. When the second passivation layer 180q of the TFT array panel 100 is the color filter, the color filter of the upper panel 200 may be omitted. Also, in an exemplary embodiment, the light blocking member 220 of the upper panel 200 may be disposed in the TFT array panel 100.

An overcoat 250 is disposed on the color filter (not shown) and the light blocking member 220. The overcoat 250 may include an insulator such as including an organic insulating material, reduces or effectively prevents the color filters from being exposed, and provides a planarized surface in the upper panel 200. In an exemplary embodiment, the overcoat 250 can be omitted.

A common electrode 270 is disposed on the overcoat 250. An upper alignment layer (not shown) is disposed on the common electrode 270. The upper alignment layer may be a vertical alignment layer, but is not limited thereto.

A liquid crystal layer 3 between the two display panels 100 and 200 has negative dielectric anisotropy, and liquid crystal molecules 31 (refer to FIG. 4) of the liquid crystal layer 3 may be aligned so that long axes thereof are perpendicular with respect to the surface of the two display panels 100 and 200 in a state in which there is no electric field applied to the liquid crystal layer 3.

Next, the basic electrode 199 will be described with reference to FIG. 4.

As shown in FIG. 4, the overall shape of the basic electrode 199 is a quadrangle. The basic electrode 199 includes a cross-shaped stem having a transverse stem 193 and a longitudinal stem 192 that are crossed. Also, the basic electrode 199 is divided into a first sub-region Da, a second sub-region Db, a third sub-region Dc and a fourth sub-region Dd by the transverse stem 193 and the longitudinal stem 192. The sub-regions Da-Dd include a plurality of first minute branches 194a, a plurality of second minute branches 194b, a plurality of third minute branches 194c, and a plurality of fourth minute branches 194d, respectively.

The first minute branches 194a obliquely extend from the transverse stem 193 or the longitudinal stem 192 in the upper-left direction, and the second minute branches 194b obliquely extend from the transverse stem 193 or the longitudinal stem 192 in the upper-right direction. Also, the third minute branches 194c obliquely extend from the transverse stem 193 or the longitudinal stem 192 in the lower-left direction, and the fourth minute branches 194d obliquely extend from the transverse stem 193 or the longitudinal stem 192 in the lower-right direction.

The first to fourth minute branches 194a-194d form an angle of about 45 degrees or 135 degrees with the gate lines 121, 122 and 123 or the transverse stem 193. Also, the minute branches 194a-194d of two neighboring sub-regions Da-Dd may be inclined in different directions such that imaginary projection lines thereof are crossed.

The minute branches 194a-194d are extended in a length direction, and a width of the minute branches 194a-194d is taken perpendicular to the length direction. The width of the minute branches 194a-194d may be in the range of about 2.5 micrometers (μm) to about 5.0 μm, and an interval between neighboring minute branches 194a-194d in each of the sub-regions Da-Dd may be in the range of about 2.5 μm to about 5.0 μm.

According to another exemplary embodiment of the invention, the width of the minute branches 194a-194d may increase in a direction towards the transverse stem 193 or the longitudinal stem 192 from a distal end thereof, and a difference between the largest width and the smallest width within one of the minute branches 194a-194d may be in the range of about 0.2 micrometer (μm) to 1.5 μm.

Each sub-pixel electrode 191a to 191d is connected to a drain electrode 175a to 175d through a contact hole 185a to 185d thereby receiving the data voltage from the drain electrode 175a to 175d, respectively. Edges of the first to fourth minute branches 194a-194d distort the electric field, and form a horizontal component that determines an inclined direction of the liquid crystal molecules 31. Referring to FIG. 4, for example, the horizontal component of the electric field is almost parallel to the edges the first to fourth minute branches 194a-194d. Accordingly, liquid crystal molecules 31 are inclined in the direction parallel to the length direction of the minute branches 194a-194d. The length directions in which the collective minute branches 194a-194d are extended in one pixel are four different directions such that the inclined directions of the liquid crystal molecules 31 are the four directions, and four domains including the different alignment directions of liquid crystal molecules 31 are formed in the liquid crystal layer 3. The viewing angle of the liquid crystal display is widened by varying the inclined directions of the liquid crystal molecules 31.

In the illustrated exemplary embodiment of the liquid crystal display according to the invention, each of four sub-pixel electrodes includes four domains, so a total of sixteen domains are formed for each pixel in the liquid crystal layer 3. Accordingly, the reference viewing angle of the liquid crystal display may be further increased.

Figure 6:
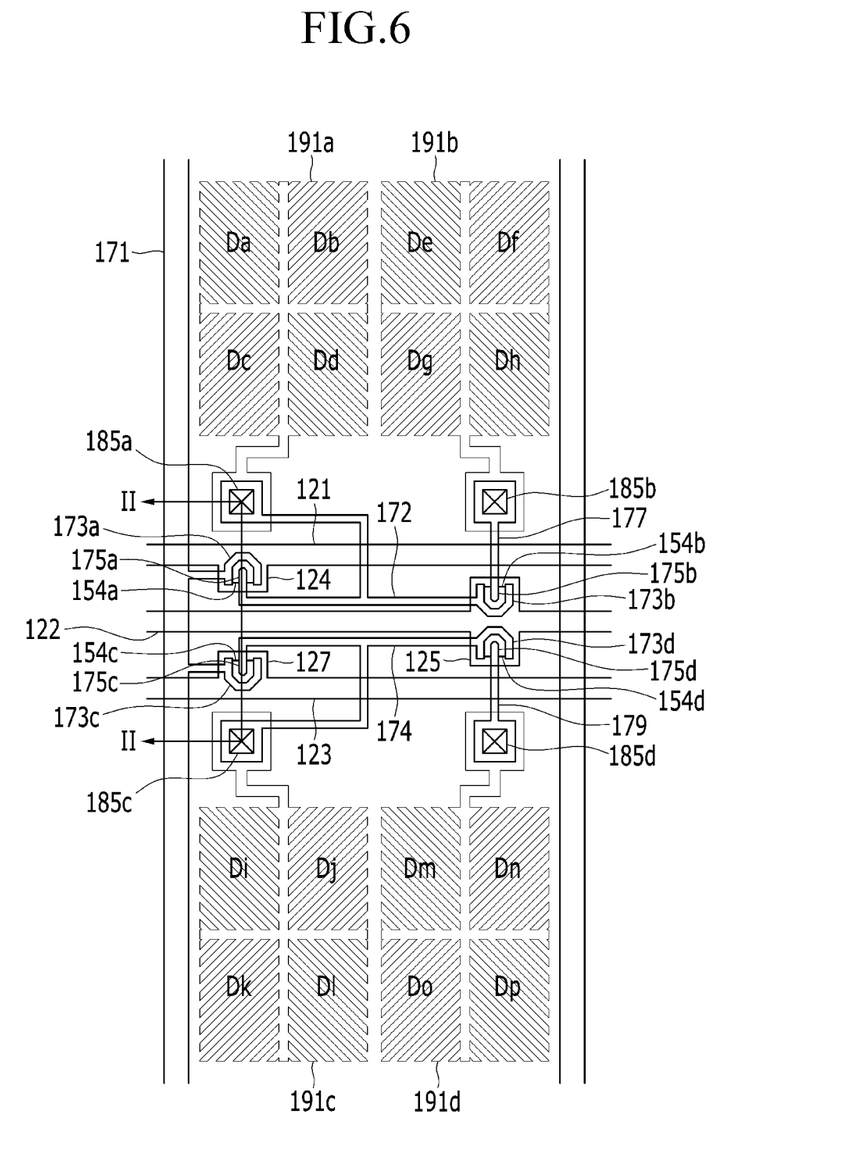
FIG. 6 is a view of an exemplary embodiment of a liquid crystal display including a plurality of domains, according to the invention.

FIG. 6 shows an exemplary embodiment of a liquid crystal display including a plurality of domains according to the invention. As shown in FIG. 6, four domains exist for each sub-pixel electrode 191a-191d so sixteen domains exist in one pixel. Each of domains Da, Db, Dc, Dd, . . . Dp in the one pixel have different inclination degrees of the liquid crystal molecules 31 according to differences of voltages applied to each sub-pixel electrode 191a-191d, and the inclination directions are different according to the extending direction of the minute branches 194a-194d of each sub-pixel electrode 191a-191d. Accordingly, in the sixteen domains of the one pixel, the inclination degrees and the inclination directions of the liquid crystal molecule 31 are all different. Therefore, the viewing angle of the liquid crystal display including the plurality of domains is increased.

Next, an exemplary embodiment of a driving method of a liquid crystal display according to the invention will be described.

In one or more exemplary embodiment of the liquid crystal display according to the invention, four sub-pixel electrodes are formed in one pixel, and the four sub-pixel electrodes are each driven by a combination of signals from one data line and three gate lines.

In a conventional liquid crystal display, lateral visibility is improved by charging different voltages to two sub-pixel electrodes. However, each sub-pixel electrode in the conventional liquid crystal display is connected to one gate line and each voltage is applied with the same gate timing, and accordingly, realizing an optimized voltage ratio for the lateral visibility is difficult.

However, in one or more exemplary embodiment of the liquid crystal display according to the invention, one pixel includes four sub-pixel electrodes, and the four sub-pixel electrodes are each driven by three gate lines. Accordingly, different data voltages may be applied to each sub-pixel electrode at the different gate timings such that the optimized voltage ratio for the lateral visibility may be realized.

That is, in one or more exemplary embodiment of the liquid crystal display according to the invention, each sub-pixel electrode is charged with a different voltage at different gate timings such that luminance may be precisely controlled in each sub-pixel corresponding to a sub-pixel electrode. That is, a magnitude of the voltage charged to each sub-pixel electrode and the timing when the voltage is applied may be appropriately controlled by three gate lines and one data line. The inclined angles of the liquid crystal molecules are different in each sub-pixel by the charged voltages, thereby changing the luminance of each sub-pixel. Therefore, when the application timing of the voltage and the magnitude of the voltage are appropriately adjusted, an image viewed from the side of the liquid crystal display is substantially similar to an image viewed from the front, and as a result improving the side visibility of the liquid crystal display is possible.

Also, in one or more exemplary embodiment of the liquid crystal display according to the invention of the liquid crystal display according to the invention, one pixel includes four sub-pixel electrodes and the number of domains is sixteen. Accordingly, the inclination directions of the liquid crystal molecules may be variously realized, thereby increasing the reference viewing angle of the liquid crystal display.

Figure 3:
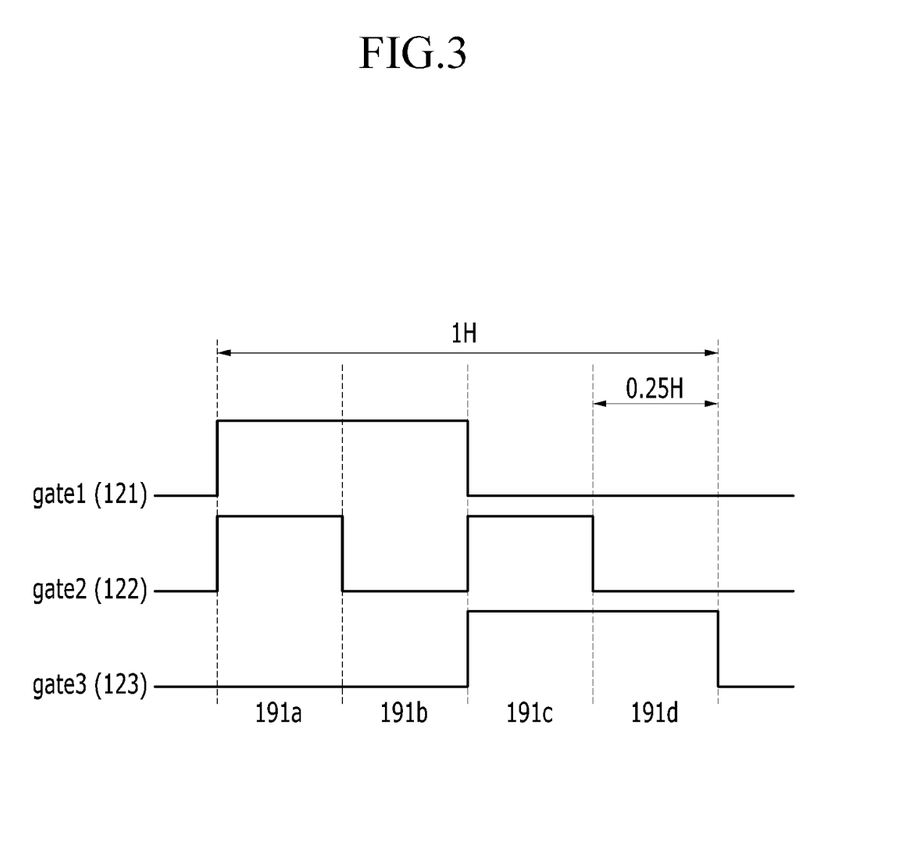
FIG. 3 is a timing diagram showing driving of an exemplary embodiment of a liquid crystal display according to the invention.
Figure 5:
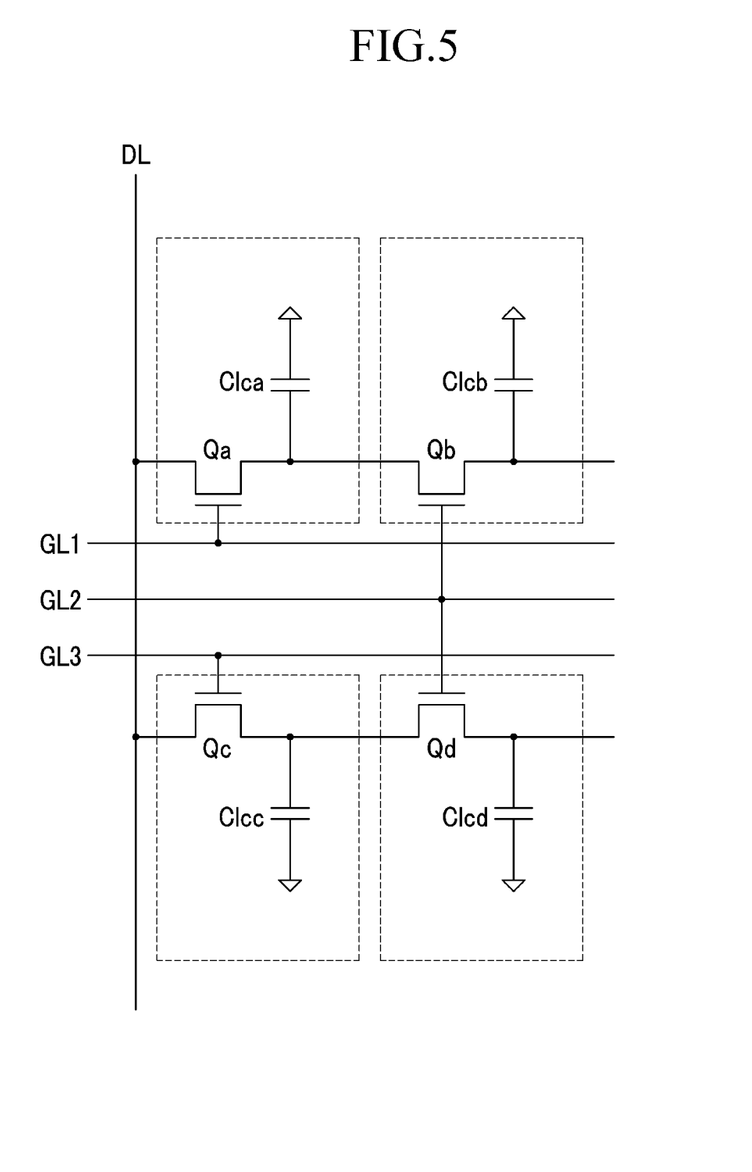
FIG. 5 is an equivalent circuit diagram of an exemplary embodiment of one pixel of a liquid crystal display according to the invention.

Next, an exemplary embodiment of a driving method of a liquid crystal display according to the invention will be described with reference to FIG. 3 and FIG. 5. FIG. 3 is a timing diagram showing driving of an exemplary embodiment of a liquid crystal display according to the invention. FIG. 5 is an equivalent circuit diagram of another exemplary embodiment of one pixel of a liquid crystal display according to the invention.

In a conventional liquid crystal display, different data voltages are applied to each sub-pixel electrode with the same timing during one horizontal period 1H. At this time, 1H may be 15.4 microseconds (μs).

However, in one or more exemplary embodiment of the liquid crystal display according to the invention, one horizontal period 1H is divided into four sub-periods each having a period of 0.25H and voltage is respectively applied to the sub-pixel electrodes at the different timings. That is, by intervals of 0.25H (=3.85 μs) as a basic unit of driving the liquid crystal display, the voltage charged to four sub-pixel electrodes is changed.

Referring to FIG. 3, voltage application timing of each gate line is different. That is, the first gate line 121 is applied with the voltage during a first two horizontal sub-periods, that is, 0H to 0.5H among the horizontal period 1H that is divided into four sub-periods, and the second gate line 122 is applied with the voltage during first and third horizontal sub-periods, that is, 0H to 0.25H, and 0.5H to 0.75H, among the horizontal period 1H that is divided into four sub-periods. The third gate line 123 is applied with the voltage during the final two horizontal sub-periods, that is, 0.5H to 1H among the horizontal period 1H that is divided into four sub-periods.

That is, as shown in FIG. 3, the voltage application timing of each gate line is different, where the voltage is applied to the first gate line 121 and the second gate line 122 during the first ¼ horizontal period, and the voltage is only applied to the first gate line 121 during the second ¼ horizontal period. Also, the voltage is applied to the second gate line 122 and third gate line 123 during the third ¼ horizontal period, and the voltage is only applied to the third gate line 123 during the fourth ¼ horizontal period. FIG. 5 is an equivalent circuit diagram of another exemplary embodiment of one pixel of a liquid crystal display according to the invention.

Referring to FIG. 5, one pixel of the liquid crystal display includes a plurality of signal lines including a data line DL transmitting a data signal and three gate lines GL1, GL2 and GL3 transmitting a gate signal. The one pixel further includes first, second, third and fourth switching elements Qa, Qb, Qc and Qd, and first, second, third and fourth liquid crystal capacitors Clca, Clcb, Clcc, and Clcd that are connected to the plurality of signal lines.

The first switching element Qa is connected to the data line DL and the first gate line GL1, and the second switching element Qb is connected to the output terminal of the first switching element and the second gate line GL2.

The first switching element Qa as a three terminal element such as a TFT includes a control terminal connected to the first gate line GL1, an input terminal connected to the data line DL, and an output terminal connected to both the first liquid crystal capacitor Clca and an input terminal of the second switching element Qb.

The second switching element Qb as the three terminal element such as the TFT includes a control terminal connected to the second gate line GL2, the input terminal connected to the first liquid crystal capacitor Clca, and an output terminal connected to the second liquid crystal capacitor Clcb.

The third switching element Qc is connected to the data line DL and the third gate line GL3, and the fourth switching element Qd is connected to an output terminal of the third switching element Qc and the second gate line GL2.

The third switching element Qc as the three terminal element includes a control terminal connected to the third gate line GL3, an input terminal connected to the data line DL, and the output terminal connected to both the third liquid crystal capacitor Clcc and an input terminal of the fourth switching element Qd.

The fourth switching element Qd as the three terminal element such as the TFT includes a control terminal connected to the second gate line GL2, the input terminal connected to the third liquid crystal capacitor Clcc, and an output terminal connected to the fourth liquid crystal capacitor Clcd.

If the first gate line GL1 is applied with the voltage, the first switching element Qa and the second switching element Qb connected thereto are turned on. Accordingly, the voltage applied to the data line DL is applied to the first sub-pixel electrode and the second sub-pixel electrode through the turned-on first switching element Qa and second switching element Qb connected thereto, respectively.

If the second gate line GL2 is applied with the voltage, the second switching element Qb and the fourth switching element Qd connected thereto are turned on. Accordingly, the voltage applied to the data line Dl is applied to the second sub-pixel electrode and the fourth sub-pixel electrode through the turned-on second switching element Qb and fourth switching element Qd connected thereto, respectively.

If the third gate line GL3 is applied with the voltage, the third switching element Qc and the fourth switching element Qd connected thereto are turned on. Accordingly, the voltage applied to the data line Dl is applied to the third sub-pixel electrode and the fourth sub-pixel electrode through the turned-on third switching element Qc and fourth switching element Qd connected thereto, respectively.

As described above, each gate line among a plurality of gate lines GL1, GL2 and GL3 is connected to different sub-pixel electrodes such that the timing when the voltage is applied for each sub-pixel electrode may be controlled by controlling the gate timing of each gate line. FIG. 3 shows the exemplary embodiment of the driving method in which the voltage is applied to the second sub-pixel electrode 191*b* during the first ¼H, the voltage is applied to the first sub-pixel electrode 191*a* during the following ¼H, the voltage is applied to the fourth sub-pixel electrode 191*d* during the following ¼H, and the voltage is applied to the third sub-pixel electrode 191*c* during the final ¼H. However, the driving sequence of each sub-pixel electrode is not limited thereto.

That is, one or more exemplary embodiment of the driving method of the liquid crystal display according to the invention uses three gate lines and one data line to respectively apply the different data voltages to each sub-pixel electrode with the different gate timings, thereby realizing the voltage ratio that is optimized for maximum lateral visibility. Also, four sub-pixel electrodes are included in one pixel such that the total number of domains is sixteen in the one pixel, and therefore, the inclination direction of the liquid crystal molecules may be variously controlled, thereby improving the lateral visibility of the liquid crystal display.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor array panel comprising:
a plurality of gate lines including a first gate line, a second gate line and a third gate line extending in one direction and parallel to each other;
a data line insulated from and intersecting the first gate line, the second gate line and the third gate line;
a first thin film transistor connected to the first gate line and the data line;
a second thin film transistor connected to the second gate line and an output terminal of the first thin film transistor;
a third thin film transistor connected to the third gate line and the data line;
a fourth thin film transistor connected to the second gate line and an output terminal of the third thin film transistor;
a first sub-pixel electrode connected to the first thin film transistor;
a second sub-pixel electrode connected to the second thin film transistor;
a third sub-pixel electrode connected to the third thin film transistor; and
a fourth sub-pixel electrode connected to the fourth thin film transistor.

2. The thin film transistor array panel of claim 1, wherein the first sub-pixel electrode and the second sub-pixel electrode are above the plurality of gate lines, and the third sub-pixel electrode and the fourth sub-pixel electrode are below the plurality of gate lines, in one pixel.

3. The thin film transistor array panel of claim 2, wherein the first, second and third gate lines respectively comprise a first, second and third gate electrode, and
an area of the second gate electrode of the second gate line is larger than an area of the first gate electrode of the first gate line and the third gate electrode of the third gate line.

4. The thin film transistor array panel of claim 3, wherein the first thin film transistor comprises the first gate electrode of the first gate line,
the third thin film transistor comprises the third gate electrode of the third gate line, and
the second thin film transistor and the fourth thin film transistor comprise the second gate electrode of the second gate line.

5. The thin film transistor array panel of claim 3, wherein the data line comprises:
a first source electrode of the first thin film transistor, on the first gate electrode, and
a third source electrode of the third thin film transistor, on the third gate electrode.

6. The thin film transistor array panel of claim 3, further comprising:
a data conductor which comprises the data line and a first connection,
wherein the first connection connects the first gate electrode of the first gate line, the second gate electrode of the second gate line and the first sub-pixel electrode.

7. The thin film transistor array panel of claim 6, wherein
a first end of the first connection is a first drain electrode of the first thin film transistor,
a second end opposite to the first end of the first connection is a second source electrode of the second thin film transistor, and
the first connection comprises a branch portion protruded from between the first and second ends thereof, connected to the first sub-pixel electrode.

8. The thin film transistor array panel of claim 3, further comprising
a data conductor which comprises the data line and a second connection,
wherein the second connection connects the second gate electrode of the second gate line, the third gate electrode of the third gate line and the third sub-pixel electrode.

9. The thin film transistor array panel of claim 8, wherein
a first end of the second connection is a third drain electrode of the third thin film transistor,
a second end opposite to the first end of the second connection is a fourth source electrode of the fourth thin film transistor, and
the second connection comprises a branch portion protruded from between the first and second ends thereof, connected to the third sub-pixel electrode.

10. The thin film transistor array panel of claim 3, further comprising
a data conductor which comprises the data line, and a third connection parallel to the data line,
wherein
a first end of the third connection is a second drain electrode of the second thin film transistor, and
a second end opposite to the first end of the third connection is connected to the second sub-pixel electrode.

11. The thin film transistor array panel of claim 3, further comprising
a data conductor which comprises the data line, and a fourth connection parallel to the data line,
wherein
a first end of the fourth connection is a fourth drain electrode of the fourth thin film transistor, and
a second end opposite to the first end of the fourth connection is connected to the fourth sub-pixel electrode.

12. The thin film transistor array panel of claim 3, wherein
signals applied to the data line and the first to third gate lines, independently drives the first to fourth sub-pixel electrodes.

13. The thin film transistor array panel of claim 12, wherein
a data voltage applied to first gate line charges the first sub-pixel electrode and the second sub-pixel electrode,
a data voltage applied to the second gate line charges the second sub-pixel electrode and the fourth sub-pixel electrode, and
a data voltage applied to the third gate line charges the third sub-pixel electrode and the fourth sub-pixel electrode.

14. The thin film transistor array panel of claim 13, wherein
the data voltages applied to the first to fourth sub-pixel electrodes are respectively different.

15. The thin film transistor array panel of claim 1, wherein
a sub-pixel electrode among the first to fourth sub-pixel electrodes comprises:
a cross-shaped stem which divides the sub-pixel electrode into four sub-regions, and
minute branches extending in different diagonal directions, respectively in the four sub-regions.

16. The thin film transistor array panel of claim 15, wherein
one pixel comprises the first to fourth sub-pixel electrodes, each of the first to fourth sub-pixel electrodes comprises the cross-shaped stem and the minute branches, and sixteen sub-regions are defined in the one pixel.

17. A liquid crystal display comprising:
a first substrate comprising:
a plurality of gate lines comprising a first gate line, a second gate line and a third gate line extending in one direction and parallel to each other;
a data line insulated from and intersecting the first gate line, the second gate line and the third gate line;
a first thin film transistor connected to the first gate line and the data line;
a second thin film transistor connected to the second gate line and an output terminal of the first thin film transistor;
a third thin film transistor connected to the third gate line and the data line;
a fourth thin film transistor connected to the second gate line and an output terminal of the third thin film transistor;
a first sub-pixel electrode connected to the first thin film transistor;
a second sub-pixel electrode connected to the second thin film transistor;
a third sub-pixel electrode connected to the third thin film transistor; and
a fourth sub-pixel electrode connected to the fourth thin film transistor;
a second substrate comprising a common electrode; and
a liquid crystal between the first substrate and the second substrate.

18. The liquid crystal display of claim 17, wherein
the first sub-pixel electrode and the second sub-pixel electrode are above the plurality of gate lines, and the third sub-pixel electrode and the fourth sub-pixel electrode are above the plurality of gate lines, in one pixel.

19. The liquid crystal display of claim 18, wherein
the first, second and third gate lines respectively comprise a first, second and third gate electrode, and
an area of the second gate electrode of the second gate line is larger than an area of the first gate electrode of the first gate line and the third gate electrode of the third gate line.

20. The liquid crystal display of claim 19, wherein
a data voltage applied to the first gate line charges the first sub-pixel electrode and the second sub-pixel electrode,
a data voltage applied to the second gate line charges the second sub-pixel electrode and the fourth sub-pixel electrode, and
a data voltage applied to the third gate line charges the third sub-pixel electrode and the fourth sub-pixel electrode.

* * * * *